United States Patent
Pietambaram et al.

(10) Patent No.: US 12,087,700 B2
(45) Date of Patent: Sep. 10, 2024

(54) EMBEDDED DIE MICROELECTRONIC DEVICE WITH MOLDED COMPONENT

(71) Applicant: Intel Corporation, Santa Clara, CA (US)

(72) Inventors: Srinivas Venkata Ramanuja Pietambaram, Chandler, AZ (US); Rahul N. Manepalli, Chandler, AZ (US); Praneeth Akkinepally, Tempe, AZ (US); Jesse C. Jones, Chandler, AZ (US); Yosuke Kanaoka, Phoenix, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 17/391,905

(22) Filed: Aug. 2, 2021

(65) Prior Publication Data

US 2021/0366835 A1 Nov. 25, 2021

Related U.S. Application Data

(62) Division of application No. 16/474,019, filed as application No. PCT/US2017/024780 on Mar. 29, 2017, now Pat. No. 11,081,448.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 21/565* (2013.01);
(Continued)

(58) Field of Classification Search
CPC ............. H01L 23/3121; H01L 23/5383; H01L 23/5384; H01L 23/5389; H01L 21/4857; H01L 21/565
See application file for complete search history.

(56) References Cited

U.S. PATENT DOCUMENTS 8,237,259 B2 * 8/2012 Pressel .................... H01L 24/19
438/689
8,304,913 B2 11/2012 Nalla et al.
(Continued)

FOREIGN PATENT DOCUMENTS

EP 2645415 A2 * 10/2013 ......... H01L 21/4828
JP 201722398 A 7/2017
(Continued)

OTHER PUBLICATIONS

"U.S. Appl. No. 16/474,019, 312 Amendment mailed May 26, 2021", 3 pgs.
(Continued)

*Primary Examiner* — Walter H Swanson
*Assistant Examiner* — Jacob T Nelson
(74) *Attorney, Agent, or Firm* — Akona IP PC (57) ABSTRACT

Microelectronic devices including an embedded die substrate including a molded component formed on or over a surface of a laminated substrate that provides a planar outer surface independent of the contour of the adjacent laminated substrate surface. The molded component may be formed over at least a portion of the embedded die. In other examples, the molded component and resulting planar outer surface may alternatively be on the backside of the substrate, away from the embedded die. The molded component may include an epoxy mold compound; and may be formed through processes including compression molding and transfer molding.

20 Claims, 7 Drawing Sheets

(51) Int. Cl.
*H01L 21/56* (2006.01)
*H01L 23/31* (2006.01)
*H01L 25/065* (2023.01)
*H01L 23/00* (2006.01)
*H01L 23/522* (2006.01)

(52) U.S. Cl.
CPC ...... *H01L 23/3121* (2013.01); *H01L 23/5383* (2013.01); *H01L 23/5384* (2013.01); *H01L 23/5386* (2013.01); *H01L 25/0652* (2013.01); *H01L 23/5221* (2013.01); *H01L 23/5381* (2013.01); *H01L 24/16* (2013.01); *H01L 2224/023* (2013.01); *H01L 2224/0233* (2013.01); *H01L 2224/16235* (2013.01)

(56) References Cited

U.S. PATENT DOCUMENTS

| | | | |
|---|---|---|---|
| 8,453,323 | B2* | 6/2013 | Sakamoto ......... H01L 23/49816 361/767 |
| 8,609,471 | B2 | 12/2013 | Xu |
| 8,736,065 | B2 | 5/2014 | Gonzalez et al. |
| 8,901,748 | B2 | 12/2014 | Manusharow et al. |
| 9,275,955 | B2 | 3/2016 | Mahajan et al. |
| 9,312,233 | B2* | 4/2016 | Manepalli ............ H05K 3/4682 |
| 9,406,658 | B2* | 8/2016 | Lee ..................... H01L 23/5389 |
| 9,496,211 | B2 | 11/2016 | Kulkarni et al. |
| 9,997,446 | B2 | 6/2018 | Kim et al. |
| 2003/0133274 | A1 | 7/2003 | Chen et al. |
| 2003/0150641 | A1 | 8/2003 | Kinayman et al. |
| 2008/0116569 | A1 | 5/2008 | Huang et al. |
| 2008/0174008 | A1 | 7/2008 | Yang et al. |
| 2011/0228464 | A1 | 9/2011 | Guzek et al. |
| 2012/0129298 | A1 | 5/2012 | Iin et al. |
| 2012/0161331 | A1* | 6/2012 | Gonzalez ................ H01L 24/82 257/774 |
| 2013/0277837 | A1 | 10/2013 | Teh et al. |
| 2014/0062607 | A1 | 3/2014 | Nair et al. |
| 2014/0248742 | A1 | 9/2014 | Gonzalez et al. |
| 2014/0299999 | A1 | 10/2014 | Hu et al. |
| 2015/0235871 | A1* | 8/2015 | Akiba ................. B32B 37/1018 156/382 |
| 2015/0279813 | A1 | 10/2015 | Chase et al. |
| 2016/0190027 | A1 | 6/2016 | Manepalli et al. |
| 2017/0179012 | A1* | 6/2017 | Shimodaira ............. H01L 24/08 |
| 2017/0301625 | A1 | 10/2017 | Mahajan et al. |
| 2019/0333861 | A1 | 10/2019 | Pietambaram et al. |
| 2020/0243448 | A1 | 7/2020 | Qian et al. |

FOREIGN PATENT DOCUMENTS

| | | | |
|---|---|---|---|
| KR | 1020100011648 | A | 3/2010 |
| WO | WO-2018182595 | A1 | 10/2018 |

OTHER PUBLICATIONS

"U.S. Appl. No. 16/474,019, Corrected Notice of Allowability mailed Jun. 21, 2021", 5 pgs.
"U.S. Appl. No. 16/474,019, Corrected Notice of Allowability mailed Jul. 1, 2021", 6 pgs.
"U.S. Appl. No. 16/474,019, Non Final Office Action mailed Oct. 20, 2020", 10 pgs.
"U.S. Appl. No. 16/474,019, Notice of Allowance mailed Mar. 23, 2021", 10 pgs.
"U.S. Appl. No. 16/474,019, Preliminary Amendment filed Jun. 26, 2019", 7 pgs.
"U.S. Appl. No. 16/474,019, PTO Response to Rule 312 Communication mailed Jun. 3, 2021", 2 pgs.
"U.S. Appl. No. 16/474,019, Response filed Jan. 20, 2021 to Non Final Office Action mailed Oct. 20, 2020", 8 pgs.
"U.S. Appl. No. 16/474,019, Response filed Sep. 2, 2020 to Restriction Requirement mailed Jul. 2, 2020", 7 pgs.
"U.S. Appl. No. 16/474,019, Restriction Requirement mailed Jul. 2, 2020", 7 pgs.
"International Application Serial No. PCT/US2017/024780, International Preliminary Report on Patentability mailed Oct. 10, 2019", 8 pgs.
"International Application Serial No. PCT/US2017/024780, International Search Report mailed Dec. 27, 2017", 4 pgs.
"International Application Serial No. PCT/US2017/024780, Written Opinion mailed Dec. 27, 2017", 6 pgs.
Boettcher, Lars, et al., "Embedding of Chips for System in Package realization—Technology and Applications", 2008 3rd International Microsystems, Packaging, Assembly & Circuits Technology Conference, (Oct. 2008), 7 pgs.
Glavchev, et al., "Determination of the Coefficient of Thermal Expansion of Epoxy Composites", Polymer Testing 21, (2002), 177-179.

* cited by examiner

EMBEDDED DIE MICROELECTRONIC DEVICE WITH MOLDED COMPONENT

PRIORITY APPLICATIONS

This application is a divisional of U.S. application Ser. No. 16/474,019, filed Jun. 26, 2019, which is a U.S. National Stage Application under 35 U.S.C. 371 from International Application No. PCT/US2017/024780, filed Mar. 29, 2017, published as WO 2018/182595, all of which are incorporated herein by reference in their entirety.

TECHNICAL FIELD

Embodiments described herein relate generally to substrates having one or more embedded die and a molded component, and to microelectronic devices including such embedded die substrates; and more particularly relate to such embedded die substrates wherein the molded component provides a planar surface of the substrate regardless of structures and surface contours on which the molded component is formed.

BACKGROUND

Microelectronic devices are packaged in multiple ways. Many forms of microelectronic devices, such as IC (integrated circuit) packages, include a substrate supporting one or more devices (referred to herein as "die"), embedded within the substrate (i.e., retained at least partially beneath a surface of the substrate) to form at least a portion of an embedded die package. In many examples, such embedded die packages may have one or more semiconductor die coupled above the surface of the embedded die substrate.

The embedding of a die within an embedded die substrate, whether a bridge die or an active die, provides many advantages. However, conventional processes used to manufacture such embedded die substrates may result in substrates having variations in outer surfaces leading to either yield losses for the substrates or complications in integrating the embedded die substrate with other structures such as one or more surface die, interposers, etc.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses example embodiments of a novel microelectronic device embedded die package, and example embodiments of processes for manufacturing such an embedded die package, as well as electronic systems incorporating the novel microelectronic device embedded die packages. In some examples as described herein, the embedded die packages include a substrate including two primary components: a base substrate that includes one or more layers of conductive traces separated by respective layers of dielectric material; and a molded component formed on or over a surface of the base substrate that provides a planar outer surface independent of the contours of the adjacent base substrate surface. The current description uses the term "embedded die" to refer to a die which is, or will be, upon completion of the substrate, embedded within the substrate.

The base substrate may be of either a cored or coreless configuration, and may include multiple layers of laminations of dielectric material vertically offset relative to the one or more layers of conductive traces. In many such examples, such laminated base substrate may be formed in a conventional manner, through vacuum lamination of the dielectric layers. Connections, such as through micro-vias or other vertically extending structures, may interconnect multiple layers of conductive traces within the substrate, for example conductive structures may establish a desired distribution of contacts from an upper surface of the substrate and/or a lower surface of the substrate, and within the substrate.

In examples including a cored base substrate, the substrate may include a generally central core. In many examples, such core may include a resin-filled glass fiber structure, which in some examples may be clad on opposing sides with a copper (Cu) or other metal which extends in a pattern forming conductive traces. In many examples, the substrate may include additional layers of conductors separated by dielectric to each side of the core, such as, for example an epoxy-based laminate material, such as, for example, Ajinomoto Build-up Film (ABF), or other materials known to persons skilled in the art.

In examples including a coreless base substrate, the substrate may be formed of multiple laminate layers, has with the cored substrates. One example of such a coreless substrate is a substrate manufactured through a bumpless build up layer (BBUL) process, in which micro-vias form interconnections between conductive structures in the buildup layers and external contact surfaces. In other examples, the substrate can include glass, ceramic, and/or semiconductor materials; and may include multiple laminations of copper or another conductor in addition to such dielectric materials.

In some examples, the molded component may be formed on or over at least a portion of the embedded die. In some examples, the base substrate may include a vacuum laminated layer over the embedded die; while in other examples the molding compound may directly contact the embedded die. In other examples, the molded component and resulting planar outer surface may be on the backside of the substrate, away from the embedded die. The molded component may include an epoxy mold compound. Example processes for forming the described planar outer surface include compression molding and transfer molding. In many examples, contacts may be formed extending through the molded component. The planar outer surface of the molded component improves the ability to form contacts at the desired locations, as described in more detail below.

The embedded die can be of various configurations. In many examples, such an embedded die may include a semiconductor substrate, and thus such a die may be generally referred to as a "semiconductor die." In some example applications the embedded die may be a "passive" component, providing only conductive pathways (referred to herein as a "bridge" die). In many such examples, such a bridge die may be used to provide interconnections between two or more semiconductor die secured above the surface of the package (termed herein, "surface die"). In some examples, such a bridge die may be formed without any layers of semiconductor material, and thus are referred to only as a "die." In some examples, multiple contacts extending from the package surface to the bridge die may be used to facilitate such interconnections. Additionally, in many such example packages, additional contacts may be formed in an upper surface of the package to connect to other vertical through contacts that may provide interconnects to structures exterior to an opposing surface of the substrate (and/or to other conductive traces within the substrate). For purposes of the present description, such vertical through contacts are also termed "through silicon vias" ("TSVs") even if the material they pass through does not include silicon.

In other example applications, the embedded die may include active circuit components beyond simple conductive interconnects. Such a die with active circuit components can include circuitry ranging from including relatively simple circuits (such as, for example, filters, voltage limiters, and the like), to much more complex circuits including, for example transistors, fuses or anti-fuses, and/or other programmable elements (such as programmable logic devices (PLMs), field programmable logic arrays (FPGAs), etc.), and/or processing (instruction executing) capabilities. For purposes of the present description, the terminology of a "bridge" die will be used for any die having only interconnect structures providing circuit pathways; and the terminology of an "active" die will be used for any die having circuit devices beyond those of a bridge die.

Figure 1:
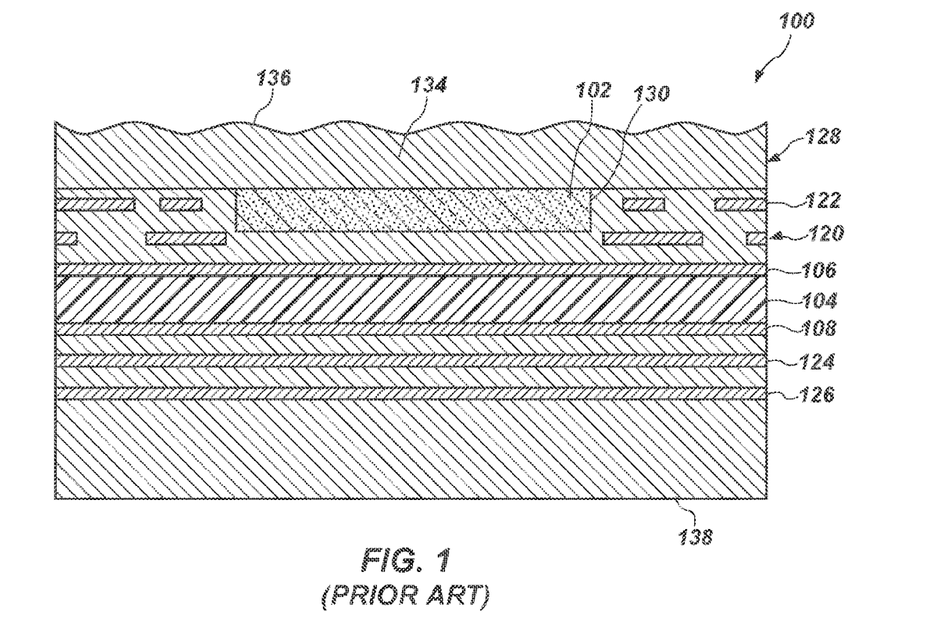
FIG. 1 depicts a cross-section of a schematic representation of a prior art embedded die package.

FIG. 1 depicts an example prior art configuration of an example substrate 100 having an embedded die 102. In the depicted example, substrate 100 includes a central core 104 including layers of a conductive foil 106, 108, laminated to opposing sides thereof. Although the conductive foil layers 106, 108 appear continuous in the depicted cross section, in other vertical sections, the layers 106, 108 may be patterned to form conductive traces at desired locations. In the example substrate 100, two additional layers of conductive traces 120, 122 and 124, 126, separated by dielectric, are formed to each side of central core 104. Though not depicted in the depicted cross section, vertical interconnects such as micro-vias may connect vertically offset conductive traces 104, 106, 120, 122, 124, 126 to form connections through the substrate, as desired. In many prior art substrates, the substrate dielectric material 128 may be formed extending at least up to uppermost conductive layer (122, in the depicted example), and a recess 130 may be formed in the dielectric material 128 to receive the embedded die 102. Once the embedded die 102 is in position within the recess 130, additional dielectric 134 may be laminated over the die, defining an upper surface 136 of the substrate 100.

In many prior art substrates such as that depicted in FIG. 1, vacuum lamination is commonly used to form the layers in the substrate, including the dielectric buildup layer 134 providing embedded die 132 encapsulation (and cavity 130 fill). A commonly experienced byproduct resulting from such vacuum lamination process is that the varying positions of the patterned conductive traces (even above and below a core, when present) can result in undulations (i.e., irregularities or other variations in surface height), in the upper surface 136, and potentially the lower surface 138, of the substrate due to partial conformance of the vacuum-laminated layers with the underlying topography. Such undulations are shown at upper surface 136, though are exaggerated in the figure for purposes of illustration. Such undulations can be problematic for both upper and lower surfaces of the substrate, but particularly so for the upper surface 136. Such undulations adversely impact the forming of contacts at the upper surface of the substrate to engage one or more surface die, and the forming of contacts extending either through the substrate or to contact locations on the embedded die. With current technologies, undulations in a vacuum laminate substrate can be as great as 10 µm to 15 µm, or even greater, over at least some portion of the surface. The undulations can be measured in terms of chip thickness variation (CTV) and also bump top variation (BTV). In each case, the higher the CTV or BTV, the lower the yield of the manufactured substrates. The problems of undulations can also become more severe as package architectures call for finer bump pitches (for example, at current technology nodes, pitches under about 55 microns) which require lower CTV/BTV in order to obtain satisfactory yields. For example, for current technology nodes, a variance in CTV and/or BTV of 10 µm or less, such as 8 µm or less, would be beneficial. For some examples, and particularly for planned device generations, such as those with bump pitches under 55 µm, a variance in CTV and/or BTV of 5 µm or less, such as 2 µm or less, would be beneficial.

Other factors impacting the surface contours in conventional vacuum laminated substrates include the embedding of one or more die; particularly where multiple die are potentially of differing heights (i.e. Z dimension), adding yet another variable. For example, some technologies may include a tile architecture, in which various functionalities of what could be manufactured as a single die are distributed among multiple die, which may then yield higher than a single die of greater complexity. In such applications in which multiple such die might be advantageously embedded within a package to which additional surface die would be attached, the contours of such multiple embedded die can further exacerbate the problem of undulations in the surface of such vacuum laminated substrates.

Proposed techniques to address such variability in CTV and/or BTV include planarization techniques, such as, for example, chemical mechanical planarization (CMP). However, such involves additional wafer handling involving equipment not normally utilized in the packaging environment. Another proposed technique involves the use of photo-imageable dielectrics (PID). However, at the current time, the use of such RD materials needs additional development before being suitable for current volume manufacturing needs.

Figure 2:
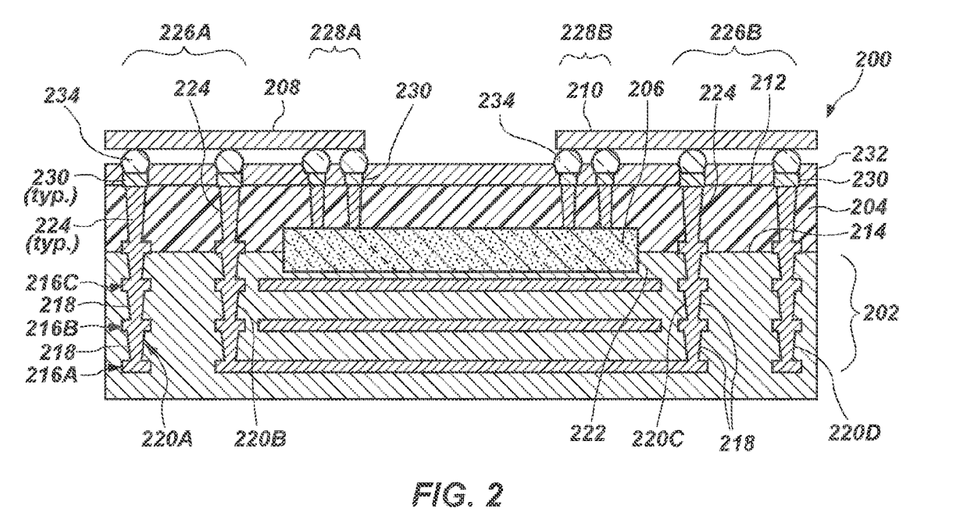
FIG. 2 depicts a cross sectional schematic representation of an example microelectronic device incorporating a package in accordance with the techniques and structures described herein.

Referring now to FIG. 2, the figure depicts a cross-sectional schematic representation of an example embedded die package 200 in accordance with the structures and techniques of the present disclosure. Embedded die package 200 includes a base substrate 202 and a molded component 204 molded to a surface of the base substrate 202, with an embedded die 206 extending partially within the outer dimensions of the base substrate 202 and embedded beneath the molded component 204. As will be described in more detail below, molded component 204 provides an essentially planar upper surface 212, the planarity of which is established independent of any undulations present in the upper surface 214 of base substrate 202 (though not specifically illustrated in the figure). Embedded die package 200 includes first and second surface die 208, 210, respectively, secured above the upper surface 212.

The base substrate 202 of embedded die package 200 includes multiple conductive layers configured to establish desired conductive paths. For illustration purposes, in example embedded die package 200, these conductive paths are formed through three metallization layers, indicated generally at 216A-C. In some examples respective conductive traces of these three metallization layers 216A-C are vertically connected by respective micro-vias, indicated typically at 218, to form conductive pathways, including, for example, vertical columns 220A-D. As in be apparent to persons skilled in the art, conductive traces of the three metallization layers 216A-C may be vertically connected at desired locations outside the plane of the cross-section of FIG. 2. As noted earlier herein, base substrate 202 may be of various constructions known to the art, including either cored or coreless constructions, and can have any number and configuration of conductive layers and interconnections formed therein, as may be necessary or desired for a specific application. The use of the molded components as described herein can provide a planar surface independent of any undulations in the laminate substrate surface below.

In many examples, the embedded die may be retained at least partially in the substrate. In some examples, the embedded die may be placed on a receiving surface of the substrate, and either additional laminate layers of the substrate or the molded component may be formed directly over the embedded die. In the depicted embedded die package 200, a recess 222 defines a receiving surface for the die, and the die is partially within the recess 222 formed in upper surface 214 of base substrate 202. In other examples, the substrate may be formed at least in part around the embedded die 206, rather than in a recess formed for the embedded die. Additionally, multiple embedded die may be formed on respective receiving surfaces of the substrate, and embedded within the substrate in the same manner described for a single embedded die.

Embedded die package includes vertical contacts (indicated typically at 224) formed to extend through the molded component 204. Vertical contacts 224 may be formed to connect with surface die 208, 210, or in other configurations may be formed to provide connection to other external components coupled to embedded die package 200. In the depicted example, the vertical contacts 224 include two groups of contacts 226A, 226B extending respectively to each of surface die 208 and 210. The vertical contacts 224 further include two additional groups of contacts 228A, 228B extending respectively between each of surface die 208 and 210, and embedded die 206. In this illustrative example, the contacts of each of groups 226A, 226B are arranged at a first pitch relative to one another; while the contacts of each of groups 228A, 228B are arranged at a second pitch relative to one another. In the depicted example the second pitch is smaller than the first pitch. The use of some contacts at a relatively lesser pitch may be desirable for some types of interface, for example relatively high speed signals. Though in many examples where contacts at different pitches are utilized, the smaller pitch may extend to the embedded die (as depicted), in other examples either all contacts through the molded component may be at the same pitch, or different pitches may be used for contacts extending to locations other than to the embedded die.

As shown in embedded die 200, for many applications the vertical contacts 224 extending through molded component 204 may have a surface treatment, such as, for example, a tin-silver (Sn-Ag) interface, as indicated typically at 230. Gold or nickel-containing alloys may also be used, as well as other surface treatments for contact pads and similar structures that are known to persons skilled in the art. In the depicted example, a protective layer 232, such as solder resist, is formed above the molded component 204, and contact balls 234 are formed to facilitate attachment to surface die 208 and 210.

Referring now to FIGS. 3A-I, the figures depict cross-sectional schematic representations of sequential stages in an example process of forming an embedded die package having a molded component similar to that discussed in reference to FIG. 2. Accordingly, except to the extent that differences from the device of FIG. 2 are expressly addressed, the description of the components of FIG. 2 are applicable to the structures in FIGS. 3A-I. The example process begins with a base substrate 300. As with base substrate 202 of FIG. 2, base substrate 300 includes three metallization layers, indicated generally at 302, 304, and 306, of which selected conductive structures in adjacent layers are interconnected by respective micro-vias, indicated typically at 308. As noted previously, base substrate 300 may be formed by any of a variety of processes, such as the vacuum lamination processes described earlier herein. As previously discussed, such vacuum lamination processes typically result in undulations in the upper surface 310 of the base substrate 300, as discussed in reference to FIG. 1. Though not specifically depicted in FIGS. 3A-I given the relative scale of the figures, such undulations should be understood to be an inherent aspect of base substrate 300 of these figures, and should be understood to be an inherent aspect of multi-layer vacuum laminated substrates.

Figure 3A:
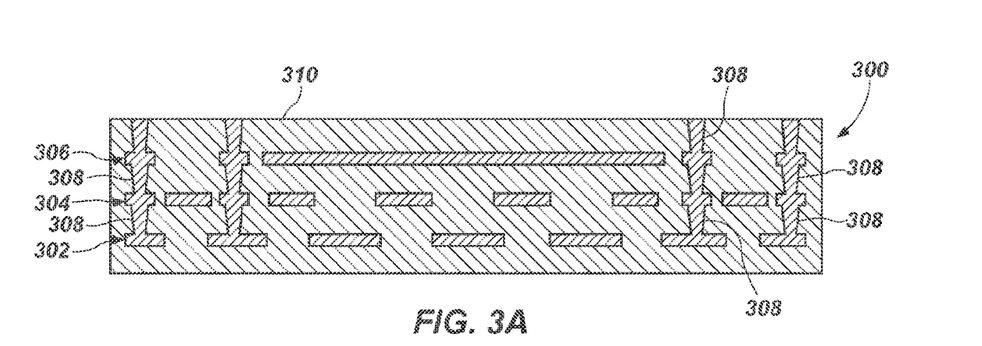
FIGS. 3A-I depict a cross-sectional schematic representations of successive stages in an example process for forming an embedded die substrate.
Figure 3B:
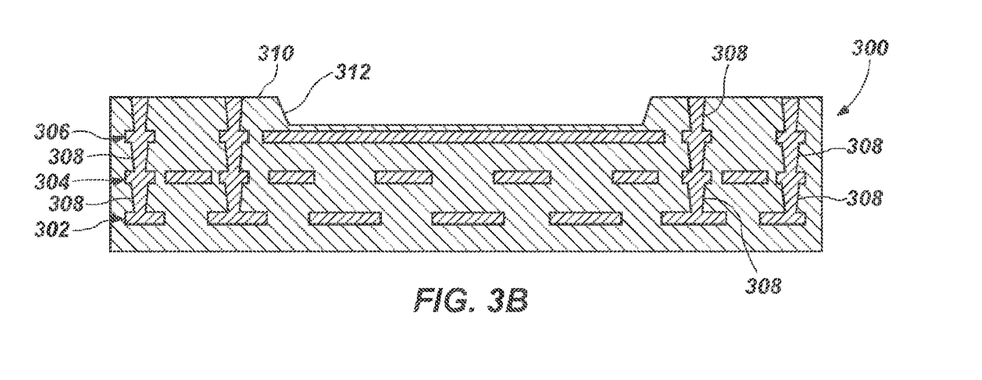

Referring to FIG. 3B, a recess 312 is formed relative to upper surface 310 of base substrate 300. Also as noted previously, in other examples, base substrate 300 may be formed to have such a recess formed as the substrate is made, rather than recess 312 being formed subsequent to the formation of base substrate 300.

Figure 3C:
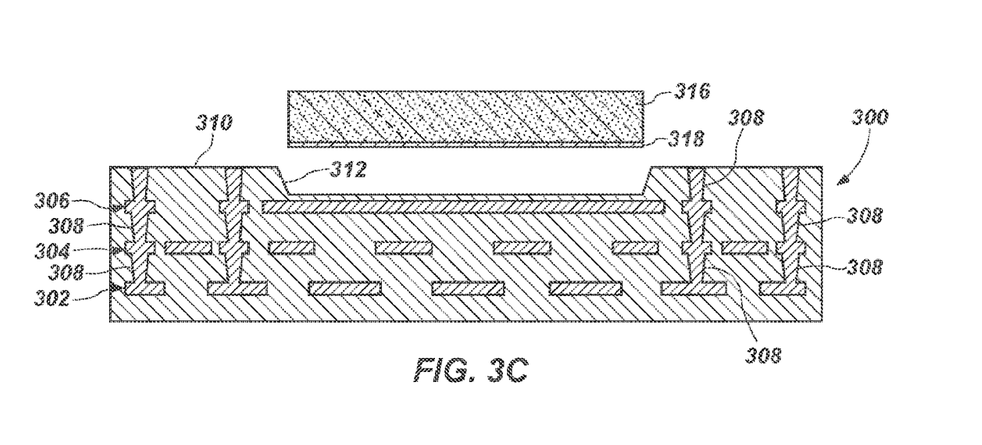

In FIG. 3C, a die 316 to be embedded within the package is placed within recess 312. In some examples, a bonding layer 318 may be formed on or otherwise associated with die 316 to assist in maintaining die 316 in a fixed orientation relative to base substrate 300 during subsequent processing. For example, bonding layer 318 may be any of various known types of die back film (DBF). An example such DBF is Nitto NX2 DBF material, available from Nitto Denko.

Figure 3D:
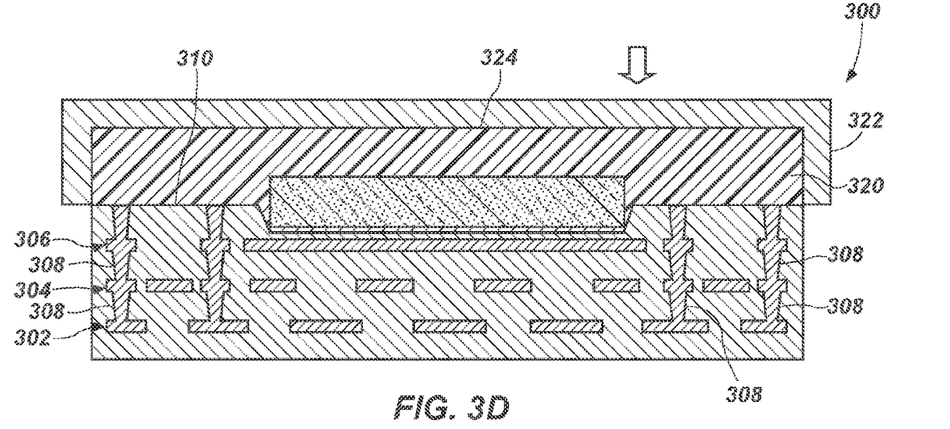
Figure 3E:
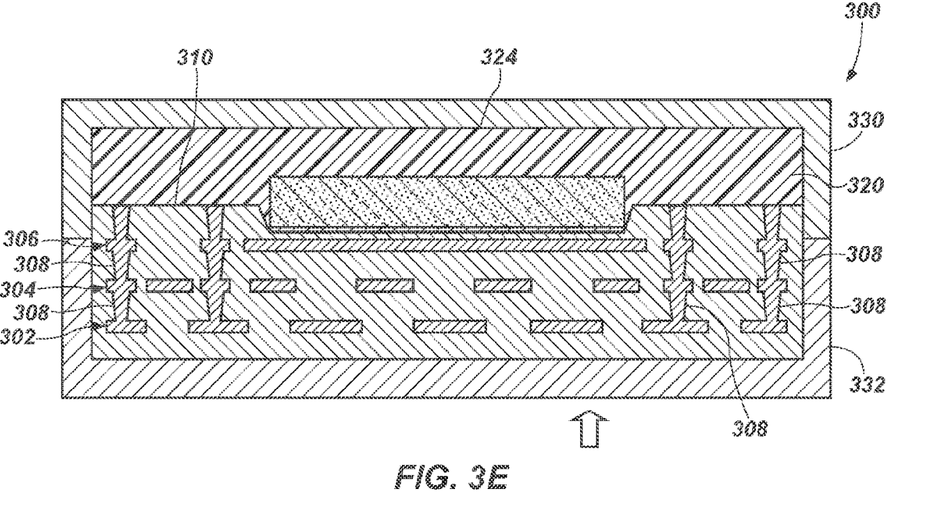

Referring now to FIGS. 3D and 3E, the figures are schematic representations of alternative processing operations. In each operation, a molded component 320 is formed extending over surface 310 of base substrate 300, and extending at least partially over embedded die 316. In many examples, such as that depicted in these figures, molded component 320 may extend completely over embedded die 316, completely encasing the die in the package. Molded component 320 may include an epoxy material, and in many examples may be formed of an epoxy mold compound as described further below. Schematically represented in FIG. 3D, molded component 320 is formed by a compression molding process within an upper platen 322. The compression molding process may also include the use of a lower platen, but since that structure is conventional, and does not bear upon the final structure, is not depicted. Upper platen 322 is configured to define molded component 320 with a planar upper surface 324. The result of the compression molding process is that upper surface 324 is formed to be planar independent of the number or magnitude of undulations or other irregularities of the underlying surface 310 of base substrate 300 (as discussed and described in reference to FIG. 1).

FIG. 3E depicts a transfer molding process, wherein upper and lower platens 330, 332, respectively, encase base substrate 300 and embedded die 316, and a mold compound, which may again be an epoxy mold compound, is pumped into the mold defined by the upper and lower platens 330, 332. As with the compression molding process, the upper surface 324 again has a planar surface that is established independent of the number or magnitude of undulations or other irregularities of the underlying surface 310 of base substrate 300 (as discussed earlier herein).

When molded component 324 is formed of an epoxy mold compound, the compound can be of multiple formulations. For compression molding, the mold compounds can be granular, liquid or film. For transfer molding, the mold compounds are usually in pellet form. The mold compound properties are chosen such that the thereto-mechanical stresses are minimized post molding. Epoxy mold compounds are known to persons skilled in the art, and include an epoxy material, a filler material, a curing agent, and a release agent and may also include additional materials). In many examples, epoxy mold compounds include filler content in a range of 70 to 90% by volume. Curing agents are provided in epoxy mold compounds to accelerate a curing reaction. In many examples, substantial curing of an epoxy mold compound may occur in 10 minutes or less. The identified release agents facilitate releasing the molded structure once curing has occurred. Epoxy mold compounds are configured to be flowable under processing temperatures (which may be, in many examples, between 120° C. and 180° C.). In many examples, epoxy mold compounds may have a viscosity of 100 Pascal-second (Pa·s) or lower at such processing temperatures. Thus epoxy mold compounds are distinct from conventional materials used for vacuum lamination, as discussed above, which typically do not include either curing agents or release agents, and which do not exhibit the above flowability/viscosities under at such processing temperatures.

For many examples for forming molded components of embedded die substrate, epoxy mold compound with a coefficient of thermal expansion (CTE) of 7-24 and an upper cut for filler (largest filler size) of less than 20 microns may be desirable. In some applications a filler size of 15 μm or less may be desirable, and in some applications a filler size of 5 μm or less may facilitate improved fill in smaller dimension regions, for example, in a recess surrounding an embedded die. Suitable epoxy mold compounds can be, for example, epoxy phenol, anhydride or amines; and may have fillers including, for example, any of silica, alumina or organic materials.

Figure 3F:
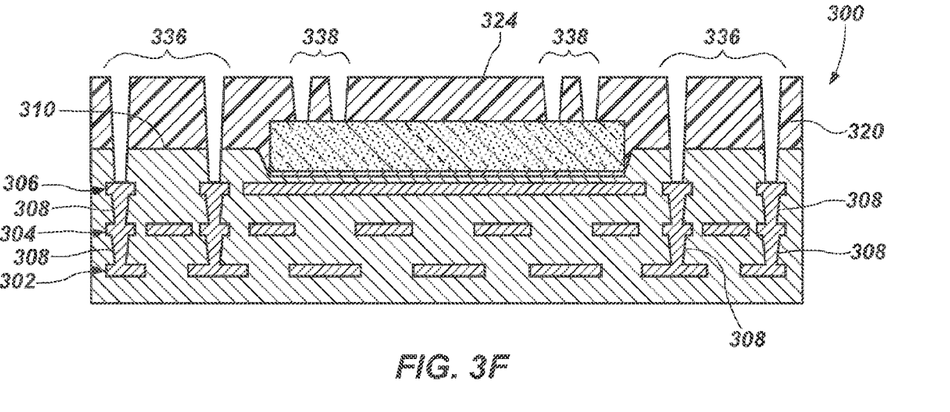

Once molded component 324 is formed and has cured to a desired state, further processing can continue. As depicted in FIG. 3F, vias (indicated typically at 336 at a wider pitch, and at 338 at a narrower pitch) may be formed through the molded component 324 at desired locations. One example method of forming vias 336, 338 is through a laser drilling process. In examples such as that depicted, wherein the vias are formed at different pitches and/or extending to different depths, it may be desirable to drill vias 336 through a different process than vias 338. For example, more widely spaced vias (which in some examples may also be of greater width) may be drilled through use of a CO2 laser, while more narrowly pitched vias (which in some examples may also be of a more limited with and/or depth) may be drilled through use of an ultraviolet (UV) laser.

Once the vias are formed, contacts 334, 336 may be formed in the vias to extend to desired locations. In some examples, the contacts may be formed through a semi-additive process. As one example, such a semi-additive process may include forming a seed layer over molded component 324. Where the contacts include copper, the seed layer may be a sputtered metallic layer, such as for example, titanium/copper (Ti/Cu). A plating resist layer may then be formed over the seed layer, and then patterned in a conventional manner to define the contours for forming contact pads and any conductive traces that may be desired at the surface of molded component 324. Subsequently, the contacts and any conductive traces may be formed through electroplating. The patterned plating resist may then be removed and the exposed portion of the seed layer removed to complete the formation and isolation of the contacts and traces.

Figure 3G:
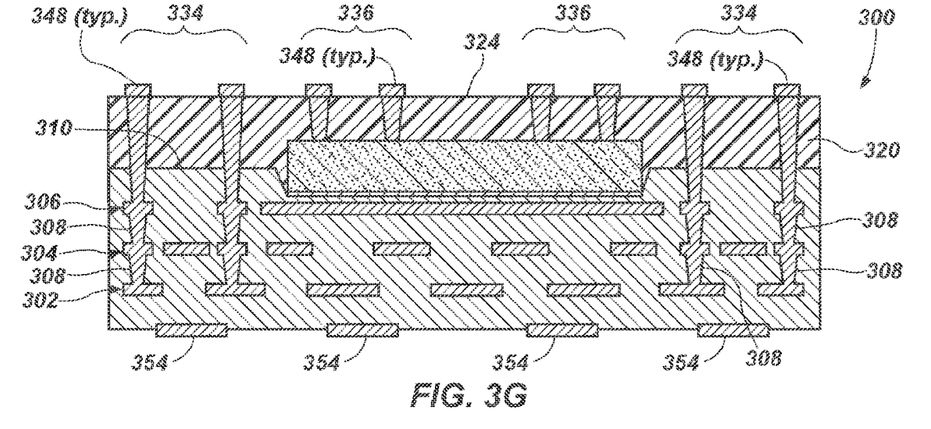
Figure 3H:
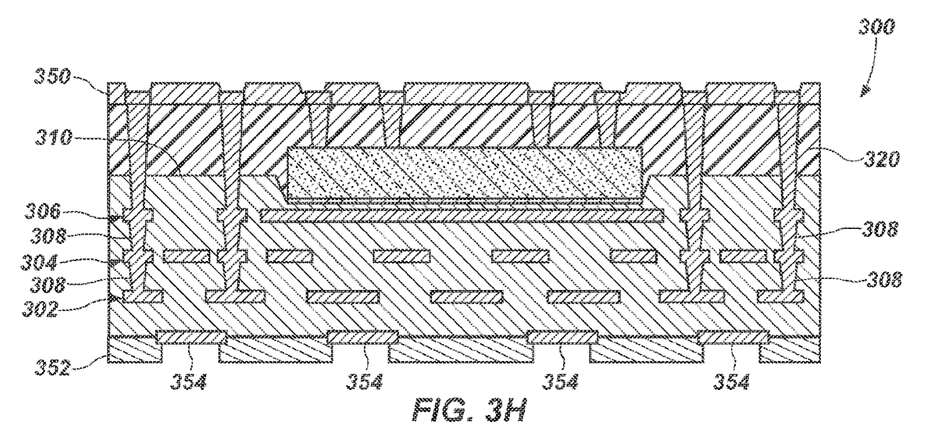
Figure 3I:
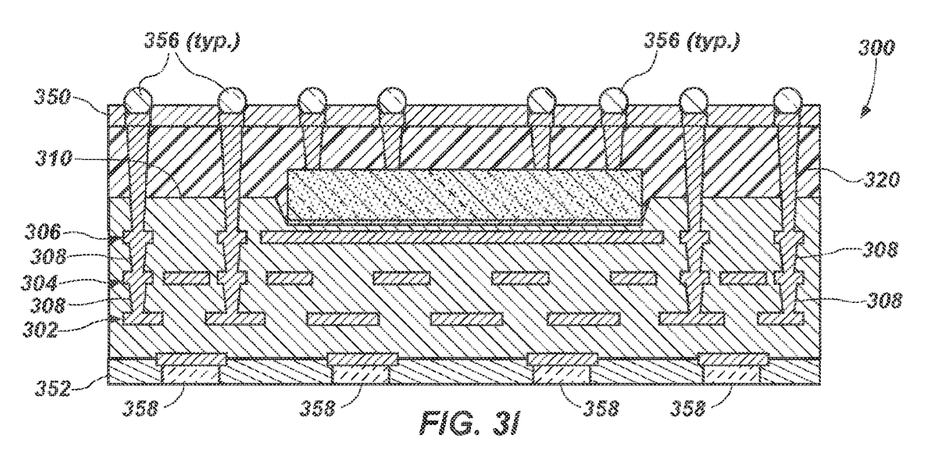

Referring now to FIG. 3G, a surface treatment as discussed above may be applied to contact surfaces, as indicated typically at 348. As shown in FIG. 3H, solder resist layers 350, 352, may be formed on both upper and lower surfaces of the package surrounding the contacts. At this stage, or subsequently, a surface treatment may be formed to contacts formed at the lower surface of base substrate 300, as indicated typically at 354. Finally, as shown in FIG. 3I, contact structures, such as contact balls, indicated typically at 356, may be formed to facilitate attachment to surface die or other structures, as discussed previously relative to FIG. 2.

Figure 4:
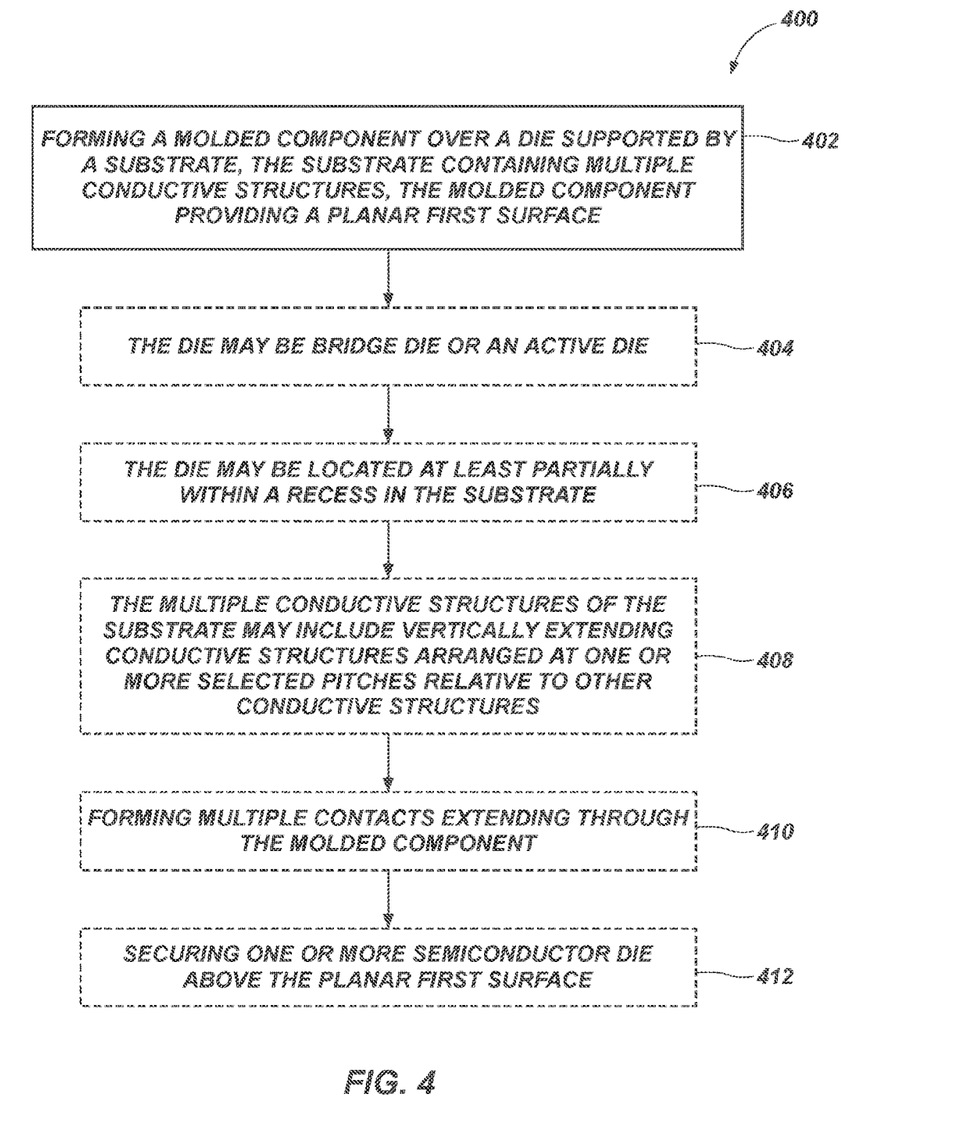
FIG. 4 depicts a flowchart of an example process flow for forming an embedded die substrate.

Referring now to FIG. 4, the figure depicts a flowchart of an example process flow 400 for forming an embedded die package. Stages of process flow 400 outlined in dashed lines are optional components or processes. As identified in 402, the process flow includes forming a molded component over a die supported by a substrate, the substrate containing multiple conductive structures, and wherein the molded component provides a planar first surface. Example stages in accordance with this portion of process flow 400 are depicted in, and discussed relative to, FIGS. 3C-E, though the process flow is not limited to the example stages of such figures. As discussed relative to FIGS. 3D-E, the planar first surface of the molded component may be essentially planar, as defined and discussed relative to those figures.

As noted above, the implementation of the operation of 402 of process flow 400, can include optional components and or processes. For example, the molded component may desirably include an epoxy mold compound as discussed herein. Additionally, the molded component may be formed by compression molding or transfer molding. As indicated at 404, the die supported by the substrate may be either a bridge die or an active die, as previously discussed herein. As another alternative, as indicated at 406, the embedded die may be located at least partially within a recess in the substrate. In other examples, the die may be located at the upper surface of the substrate, though such configurations would potentially impact the Z height of the completed package. As another alternative in the structure of the substrate to which the molded component is applied, as indicated at 408, the multiple conductive structures of the substrate may include vertically extending conductive structures arranged at one or more selected pitches relative to other conductive structures. Many other optional structures and processes may be used in the performing of operation 402 of example process flow 400.

As indicated at 410, the example process flow further comprises forming multiple contacts extending through the molded component. In some examples, the multiple contacts may include contacts arranged at different pitches relative to other contacts, which in many examples may be used to connect with vertically extending conductive structures in the substrate that are arranged at different pitches. This type of structure is discussed in reference to FIGS. 2 and FIGS. 3F-G.

As indicated at 412, example process flow 400 further includes securing one or more semiconductor die above the planar first surface of the molded component. In many examples, these one or more semiconductor die may be secured to make electrical contact with one or more of the contacts formed in the molded component. Similarly, as discussed relative to FIG. 2, one or more of the semiconductor die may couple through selected contacts directly to the embedded die within the molded component. In many examples, two or more semiconductor die may be secured above the first surface; and in some examples other types of devices, including other forms of die, interposers, etc. may be secured above the first surface of the molded component.

Figure 5A:
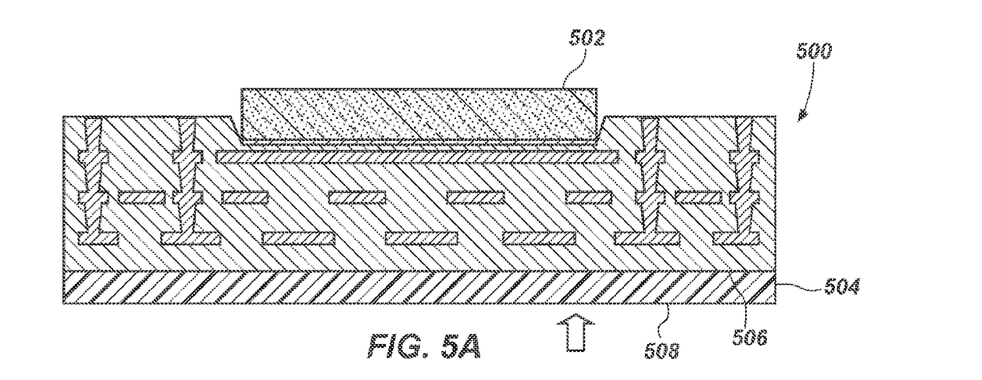
FIG. 5A-B depict cross-sectional schematic representations of successive stages in an alternative example process for forming an embedded die package.
Figure 5B:
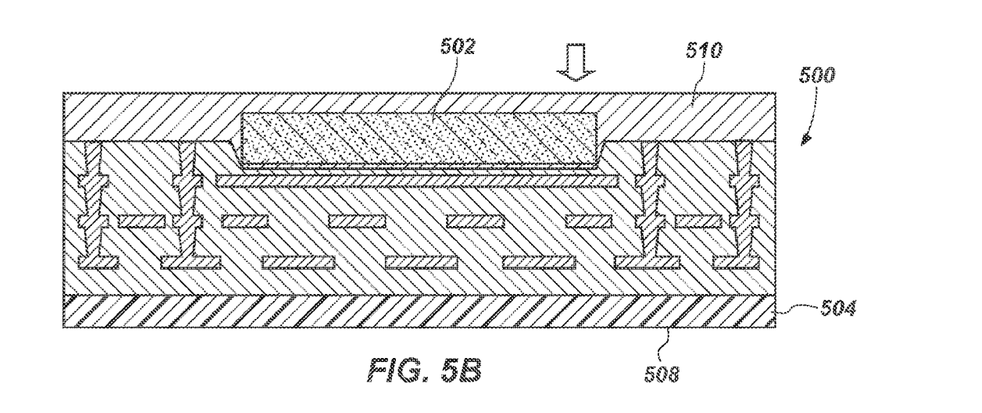

Referring now to FIGS. 5A-B, the figures depict cross-sectional schematic representations of successive stages in an alternative example process for forming an embedded die package. In the depicted example, a molded component may be formed over the "backside" of the substrate (i.e. the side opposite that proximate one or more embedded die). The issues with forming of substrates through use of multiple laminations, and the resulting potential for undulations in the upper surface of the substrate have been previously discussed. These same undulations can be present on the backside of the substrate, and when present can also transfer through the multiple laminations to exacerbate undulations at the upper surface of the substrate. As a result, in some applications it may be desirable to form a molded component on the backside of the substrate.

FIG. 5A depicts an example substrate, which may be constructed in any desired manner, as discussed in detail relative to base substrate 300 of FIGS. 3A-I. For purposes of the provided example, all aspects of substrate 500 and of embedded die 502 can be directly analogous to the description of corresponding structures in FIGS. 3A-I, and thus the description will not be repeated here. A molded component 504 is molded over backside surface 506 of substrate 500. As previously discussed, in many examples the molded component may include an epoxy mold compound; and the component may be formed through molding mechanisms which provide a planar outer surface 508 independent of the surface characteristics of backside surface 506. In many examples, the molding mechanism may be compression molding or transfer molding, as discussed earlier herein.

Referring now to FIG. 5B, an encapsulating layer 510 may be formed to at least partially cover embedded die 502. For all the reasons described earlier herein, encapsulating layer 510 may advantageously be a molded component, for example including an epoxy mold compound, and molded through a process as discussed relative to FIGS. 3A-I to establish a planar outer surface independent of the contours of the substrate beneath. In such examples, the completed package would include molded components relative to both the first side proximate the (one or more) embedded die and the opposing side, opposite the (one or more) embedded die. However, the use of such a molded component for encapsulating layer 510 is optional, and in some examples the encapsulating layer may be a vacuum molded layer, such as, in some examples, of the same dielectric material used in the formation of substrate 500 (such as, for example, an ABF or similar material).

Figure 6:
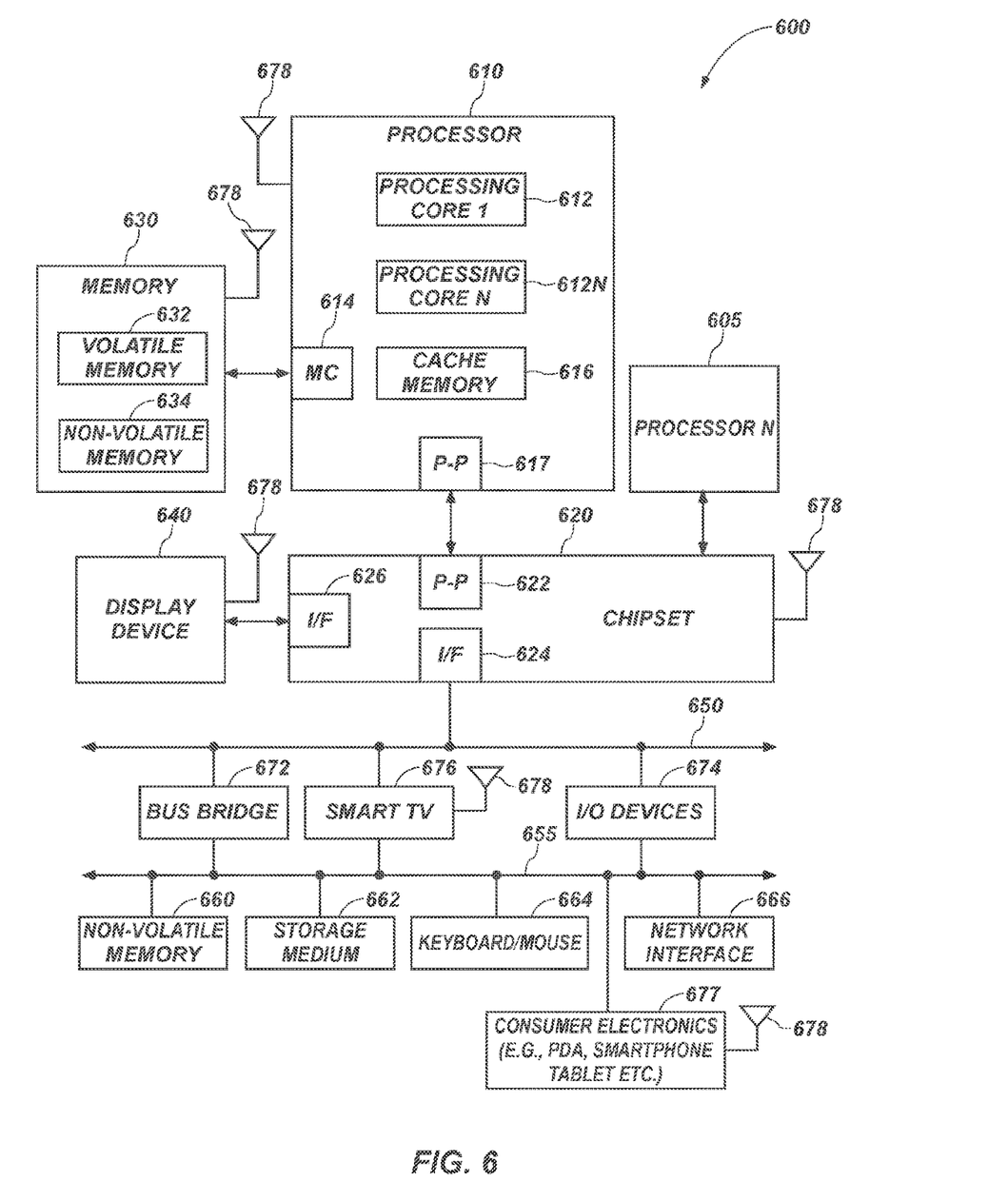
FIG. 6 depicts a system level diagram which may incorporate a microelectronic device including an embedded die package such as any of the embedded die packages configured or formed as described herein.

FIG. 6 illustrates a system level diagram, according to one embodiment of the invention. For instance, FIG. 6 depicts an example of an electronic device (e.g., system) including the microelectronic device embedded die package constructed as described herein. As noted above, the embedded die package having the molded component providing a planar surface independent of the contours of an underlying substrate are able to provide higher-yielding packages for incorporation into such systems. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV) Ultra Wide Band (UWB), Bluetooth WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, a network interface 666, a smart TV 676, consumer electronics 677, etc., via interface 624.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB) Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the methods and apparatuses described herein, a non-limiting set of example embodiments are set forth below as numerically identified examples:

Example 1 is a microelectronic device, comprising: a substrate defining multiple layers of conductive traces separated by respective layers of dielectric material; a molded component molded to a surface of the substrate, the molded component defining a planar outer surface independent of undulations of the surface of the substrate; and an embedded die at least partially within the substrate and at least partially within the molded component.

In Example 2, the subject matter of Example 1 where the molded component is formed through a compression molding process.

In Example 3, the subject matter of any one or more of Examples 1-2 where the molded component is formed through a transfer molding process.

In Example 4, the subject matter of any one or more of Examples 1-3 optionally include first and second surface die secured above the planar surface of the molded component, where at least one of the first and second surface die is coupled to the embedded die through at least one conductive trace of the substrate.

In Example 5, the subject matter of any one or more of Examples 1-4 optionally include first and second surface die secured above the planar surface of the molded component, where the first and second surface die are coupled to one another through the embedded die.

In Example 6, the subject matter of Example 5 where each of the first and second surface die is coupled to the embedded die through contacts extending through the molded component.

In Example 7, the subject matter of any one or more of Examples 1-6 where the substrate comprises multiple layers formed by a vacuum lamination process.

In Example 8, the subject matter of Example 7 where the substrate has a surface with undulations of 10 μm or greater in at least some portion of the surface.

In Example 9, the subject matter of any one or more of Examples 1-8 where the embedded die is a bridge die.

In Example 10, the subject matter of any one or more of Examples 1-9 where the embedded die is an active die, In Example 11, the subject matter of any one or more of Examples 1-10 optionally include contacts extending through the molded component to the substrate.

In Example 12, the subject matter of any one or more of Examples 1-11 optionally include contacts extending through the molded component to the embedded die.

In Example 13, the subject matter of any one or more of Examples 1-12 optionally include multiple embedded die.

In Example 14, the subject matter of any one or more of Examples 4-13 optionally include a first group of contacts extending though the molded component and arranged at a first pitch with respect to one another; and a second group of contacts extending through the molded component and arranged at a second pitch with respect to one another, the second pitch smaller than the first pitch.

In Example 15, the subject matter of Example 14 where at least some contacts of the second group extend to the embedded die.

In Example 16, the subject matter of Example 15 where a first portion of contacts of the second group extend between the first surface die and the embedded die.

In Example 17, the subject matter of any one or more of Examples 1-16 where the molded component is formed through a molding process using an epoxy mold compound in any of a liquid, pellet, or powder form.

In Example 18, the subject matter of any one or more of Examples 1-17 where the molded component comprises an epoxy mold compound.

In Example 19, the subject matter of Example 18 where the epoxy mold compound has a coefficient of thermal expansion within the range of 7 to 24.

In Example 20, the subject matter of Example 19 where the epoxy mold compound comprises a filler having a particle size less than 20 μm.

In Example 21, the subject matter of Example 20 where the epoxy mold compound comprises a filler having a particle size less than 15 μm.

In Example 22, the subject matter of any one or more of Examples 19-21 where the epoxy mold compound comprises a filler having a particle size less than 5 μm.

In Example 23, the subject matter of any one or more of Examples 18-22 where the epoxy mold compound comprises one or more of epoxy phenol, anhydride, or amines.

In Example 24, the subject matter of any one or more of Examples 18-23 where the epoxy mold compound comprises a filler including one or more of silica, alumina, or organic material.

Example 25 is a method of forming an embedded die package, comprising: forming a substrate, the substrate defining multiple layers of conductive traces separated by respective layers of dielectric material; placing an embedded die on a receiving surface of the substrate; and forming a molded component extending over an upper surface of the substrate and over at least a portion of the first embedded die, the molded component formed with a planar outer surface independent of undulations at the surface of the substrate.

In Example 26, the subject matter of Example 25 where forming the molded component comprises compression molding of a mold compound.

In Example 27, the subject matter of any one or more of Examples 25-26 where forming the molded component comprises transfer molding of a mold compound.

In Example 28, the subject matter of any one or more of Examples 25-27 optionally include forming contacts extending through the molded component.

In Example 29, the subject matter of any one or more of Examples 25-28 where forming the molded component comprises forming the molded component above the embedded die to form the planar outer surface extending above the embedded die.

In Example 30, the subject matter of Example 29 optionally includes forming contacts extending through the molded component.

In Example 31, the subject matter of Example 30 optionally includes attaching first and second surface die above the planar outer surface of the molded component, each of the first and second surface die in electrical communication with respective contacts extending through the molded component.

In Example 32, the subject matter of Example 31 where forming contacts extending through the molded component comprises: forming a first group of contacts arranged at a first pitch relative to one another; and forming a second group of contacts arranged at a second pitch relative to one another, the second pitch smaller than the first pitch.

In Example 33, the subject matter of Example 32 where multiple contacts of the second group of contacts arranged at the second pitch extend to contact the embedded die.

In Example 34, the subject matter of Example 33 where the at least one of the multiple contacts couples the first surface die to the embedded die.

In Example 35, the subject matter of Example 34 where at least one of the multiple contacts couples the second surface die to the embedded die.

In Example 36, the subject matter of any one or more of Examples 25-35 optionally include forming a die-receiving recess in the substrate, and where the receiving surface is a surface of the recess.

In Example 37, the subject matter of any one or more of Examples 25-36 where the embedded die is a bridge die.

In Example 38, the subject matter of any one or more of Examples 25-37 where the embedded die is an active die.

In Example 39, the subject matter of any one or more of Examples 36-38 where the substrate is a multi-layer vacuum-laminated substrate.

In Example 40, the subject matter of Example 39 where the substrate has a surface with undulations of 10 μm or greater in at least some portion of the surface.

In Example 41, the subject matter of any one or more of Examples 25-40 where forming the molded component comprises forming an epoxy mold compound.

In Example 42, the subject matter of Example 41 where forming the molded component comprises using epoxy mold compound in any of a liquid, pellet, or powder form for the molding process.

In Example 43, the subject matter of any one or more of Examples 41-42 where the epoxy mold compound comprises a filler having a particle size less than 20 μm.

In Example 44, the subject matter of Example 43 where the epoxy mold compound comprises a filler having a particle size less than 15 μm.

In Example 45, the subject matter of any one or more of Examples 41-44 where the epoxy mold compound has a coefficient of thermal expansion within the range of 7 to 24.

In Example 46, the subject matter of Example 45 where the epoxy mold compound comprises one or more of epoxy phenol, anhydride, or amines.

In Example 47, the subject matter of any one or more of Examples 41-46 where the epoxy mold compound comprises a filler including one or more of silica, alumina, or organic material.

In Example 48, the subject matter of any one or more of Examples 25-47 optionally include attaching first and second surface die above the planar outer surface of the molded component, each of the first and second surface die in electrical communication with respective contacts extending through the molded component.

Example 49 is a method of forming a microelectronic device package, comprising: forming a molded component covering a surface of a laminated substrate and at least partially covering an embedded die; where the molded component includes an epoxy mold compound, the molded component having a planar surface over the laminated substrate, the planarity of the molded component formed independent of contours of the surface of the laminated substrate; attaching one or more surface die above the planar surface of the molded component.

In Example 50, the subject matter of Example 49 optionally includes forming multiple contacts extending through the molded component.

In Example 51, the subject matter of any one or more of Examples 49-50 where forming multiple contacts extending through the molded component comprises forming one or more contacts extending to contact the embedded die.

In Example 52, the subject matter of Example 51 where one or more surface die are in electrical communication with the embedded die through contacts of the multiple contacts.

In Example 53, the subject matter of any one or more of Examples 49-52 where forming the molded component comprises forming an epoxy mold compound.

In Example 54, the subject matter of Example 53 where forming the molded component comprises using epoxy mold compound in any of a liquid, pellet, or powder form for the molding process.

In Example 55, the subject matter of any one or more of Examples 53-54 where the epoxy mold compound comprises a filler having a particle size less than 15 μm.

In Example 56, the subject matter of any one or more of Examples 53-55 where the epoxy mold compound has a coefficient of thermal expansion within the range of 7 to 24.

Example 57 is an electronic system, comprising: a microelectronic device, comprising, a substrate defining multiple layers of conductive traces separated by respective layers of dielectric material, a molded component molded to a surface of the substrate, the molded component defining a planar outer surface independent of undulations of the surface of the substrate, and an embedded die at least partially within the substrate and at least partially underneath the molded component, multiple contacts extending though the molded component, at least a first group of the multiple contacts extending to contact the embedded die, and first and second surface die coupled above the planar surface of the molded component, each of the first and second surface die electrically coupled through respective contacts of the first group of contacts to the embedded die; and at least one of another microelectronic device, a mass storage device and a network interface operably coupled to the microelectronic device.

In Example 58, the subject matter of Example 57 where the embedded die is a bridge die.

In Example 59, the subject matter of any one or more of Examples 57-58 where the embedded die is an active die.

In Example 60, the subject matter of any one or more of Examples 57-59 where at least one of the first and second surface die is coupled to the embedded die through at least one conductive trace of the substrate.

In Example 61, the subject matter of any one or more of Examples 57-60 where the first and second surface die are coupled to one another through the embedded die.

In Example 62, the subject matter of any one or more of Examples 57-61 where both of the first and second surface die are coupled to the embedded die through contacts extending through the molded component.

In Example 63, the subject matter of any one or more of Examples 57-62 optionally include contacts extending through the molded component to the substrate.

In Example 64, the subject matter of any one or more of Examples 57-63 optionally include contacts extending through the molded component to the embedded die.

In Example 65, the subject matter of any one or more of Examples 57-64 optionally include multiple embedded die.

In Example 66, the subject matter of any one or more of Examples 57-65 optionally include a first group of contacts extending though the molded component and arranged at a first pitch with respect to one another; and a second group of contacts extending through the molded component and arranged at a second pitch with respect to one another, the second pitch smaller than the first pitch.

In Example 67, the subject matter of Example 66 where at least some contacts of the second group extend to the embedded die.

In Example 68, the subject matter of Example 67 where at least a first portion of contacts of the second group extend between the first surface die and the embedded die.

In Example 69, the subject matter of any one or more of Examples 7-68 where the molded component is formed through either a compression molding process or a transfer molding process.

In Example 70, the subject matter of Example 69 where the molding process uses an epoxy mold compound in any of a liquid, pellet, or powder form.

In Example 71, the subject matter of any one or more of Examples 57-70 where the molded component comprises an epoxy mold compound.

In Example 72, the subject matter of Example 71 optionally includes an epoxy mold compound having a coefficient of thermal expansion within the range of 7 to 24.

In Example 73, the subject matter of Example 72 optionally includes an epoxy mold compound comprises a filler having a particle size less than 20 µm.

In Example 74, the subject matter of Example 73 optionally includes an epoxy mold compound comprises a filler having a particle size less than 15 µm.

In Example 75, the subject matter of any one or more of Examples 71-74 where the epoxy mold compound comprises one or more of epoxy phenol, anhydride, or amines.

In Example 76, the subject matter of Example 75 where the epoxy mold compound comprises a filler including one or more of silica, alumina, or organic material.

In Example 77, the subject matter of any one or more of Examples 1-24 optionally includes an embedded die substrate formed through any of the processes of Examples 24-48.

In Example 78, the subject matter of any one or more of Examples 57-76 optionally includes a microelectronic device formed according to any of the processes of Examples 49-56.

In Example 79, the subject matter of any one or more of Examples 49-56 optionally includes an embedded die substrate formed according to any of the processes of Examples 1-31.

In Example 80, the subject matter of any one or more of Examples 57-76 optionally includes an embedded die substrate formed according to any of the processes of Examples 25-48.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

What is claimed:

1. A method of forming an embedded die package, comprising:
   forming a substrate, the substrate defining multiple layers of conductive traces separated by respective layers of dielectric material;
   placing an embedded die on a receiving surface of the substrate;
   forming a molded component extending over a surface of the substrate and over at least a portion of the embedded die, the molded component formed with a planar outer surface independent of undulations at the surface of the substrate; and
   forming multiple vertical contacts including:
      a first group of vertical contacts extending though the molded component and arranged at a first pitch with respect to one another; and
      a second group of contacts extending through the molded component and arranged at a second pitch with respect to one another, the second pitch smaller than the first pitch.

2. The method of claim 1, wherein forming the molded component comprises compression molding of a mold compound.

3. The method of claim 1, wherein forming the molded component comprises transfer molding of a mold compound.

4. The method of claim 1, wherein forming the molded component comprises forming the molded component above the embedded die to form the planar outer surface extending above the embedded die.

5. The method of claim 1, further comprising attaching first and second surface die above the planar outer surface of the molded component, each of the first and second surface die in electrical communication with respective contacts extending through the molded component.

6. The method of claim 5, wherein multiple contacts of the second group of contacts arranged at the second pitch extend to contact the embedded die.

7. The method of claim 6, wherein the at least one of the multiple contacts couples the first surface die to the embedded die.

8. The method of claim 7, wherein at least one of the multiple contacts couples the second surface die to the embedded die.

9. The method of claim 1, further comprising:
   forming a die-receiving recess in the substrate, and wherein the receiving surface is a surface of the recess.

10. The method of claim 1, wherein the embedded die is a bridge die.

11. The method of claim 1, wherein the embedded die is an active die.

12. The method of claim 9, wherein the substrate is a multi-layer vacuum-laminated substrate.

13. The method of claim 12, wherein the substrate has a surface with undulations of 10 μm or greater in at least some portion of the surface.

14. The method of claim 1, wherein forming the molded component comprises forming an epoxy mold compound, comprising particles of filler having a dimension of less than 20 μm.

15. The method of claim 1, further comprising attaching first and second surface die above the planar outer surface of the molded component, each of the first and second surface die in electrical communication with respective contacts extending through the molded component.

16. The method of claim 1, wherein forming the molded component comprises forming an epoxy mold compound having a coefficient of thermal expansion within a range of 7 to 24.

17. A method of forming a microelectronic device package, comprising:
   forming a molded component covering a surface of a laminated substrate and at least partially covering an embedded die;
   wherein the molded component includes an epoxy mold compound, the molded component having a planar surface over the laminated substrate, the planar surface of the molded component formed independent of contours of the surface of the laminated substrate;
   attaching one or more surface die above the planar surface of the molded component; and forming multiple vertical contacts including,
   a first group of vertical contacts extending though the molded component and arranged at a first pitch with respect to one another; and
   a second group of contacts extending through the molded component and arranged at a second pitch with respect to one another, the second pitch smaller than the first pitch.

18. The method of claim 17, wherein forming multiple vertical contacts extending through the molded component comprises forming one or more contacts extending to contact the embedded die.

19. The method of claim 18, wherein one or more surface die are in electrical communication with the embedded die through one or more of the multiple vertical contacts.

20. The method of claim 17, wherein forming the molded component comprises forming an epoxy mold compound having a coefficient of thermal expansion within a range of 7 to 24.

* * * * *

UNITED STATES PATENT AND TRADEMARK OFFICE
CERTIFICATE OF CORRECTION

| | |
|---|---|
| PATENT NO. | : 12,087,700 B2 |
| APPLICATION NO. | : 17/391905 |
| DATED | : September 10, 2024 |
| INVENTOR(S) | : Srinivas Venkata Ramanuja Pietambaram et al. |

It is certified that error appears in the above-identified patent and that said Letters Patent is hereby corrected as shown below:

On the Title Page

On Page 2, in Item (56), under "Other Publications", in Column 2, Line 7, delete "malled" and insert -- mailed --, therefor.

In the Claims

In Column 17, Claim 1, Line 26, delete "though" and insert -- through --, therefor.

In Column 18, Claim 17, Line 38, delete "though" and insert -- through --, therefor.

Signed and Sealed this
Fifteenth Day of October, 2024

Katherine Kelly Vidal
*Director of the United States Patent and Trademark Office*